(12) United States Patent
Maggard et al.

(10) Patent No.: US 10,694,085 B2
(45) Date of Patent: Jun. 23, 2020

(54) OPTICAL SENSOR HOUSING

(71) Applicant: MTD Products Inc, Valley City, OH (US)

(72) Inventors: Jay E. Maggard, Polk, OH (US); Gregory Gorsage, Litchfield, OH (US); Aaron D. Smith, Zionsville, IN (US)

(73) Assignee: MTD PRODUCTS INC, Valley City, OH (US)

( * ) Notice: Subject to any disclaimer, the term of this patent is extended or adjusted under 35 U.S.C. 154(b) by 0 days.

(21) Appl. No.: 16/119,237

(22) Filed: Aug. 31, 2018

(65) Prior Publication Data

US 2019/0075225 A1  Mar. 7, 2019

Related U.S. Application Data

(60) Provisional application No. 62/553,446, filed on Sep. 1, 2017.

(51) Int. Cl.
*H04N 5/225* (2006.01)
*G02B 7/02* (2006.01)
(Continued)

(52) U.S. Cl.
CPC ........... *H04N 5/2253* (2013.01); *G02B 7/022* (2013.01); *H04N 5/2252* (2013.01);
(Continued)

(58) Field of Classification Search
CPC .. H04N 5/2253; H04N 5/2252; H04N 5/2254; G02B 7/02; H05K 5/0247; H05K 5/0004; H05K 5/0073
See application file for complete search history.

(56) References Cited

U.S. PATENT DOCUMENTS 5,210,644 A * 5/1993 Nomura ................... G02B 7/10
359/694
2005/0195503 A1  9/2005 Chen
(Continued)

FOREIGN PATENT DOCUMENTS

CN        204807110 U     11/2015
EP          2878999 A1     6/2015
(Continued)

OTHER PUBLICATIONS

International Search Report and Written Opinion dated Apr. 1, 2019, issued in International Application No. PCT/US2018/049023, 21 pages.
(Continued)

*Primary Examiner* — Daniel P Wicklund
*Assistant Examiner* — Sagar Shrestha
(74) *Attorney, Agent, or Firm* — Wegman Hessler

(57) ABSTRACT

An optical sensor housing includes a sensor housing body including an enclosure wall upstanding from a bottom portion and a substantially open top portion defining a cavity in which the optical sensor assembly is located, at least one aperture, and at least one engaging part projecting orthogonally from an outside surface of the sensor housing body, a sensor housing cover including an open central portion, at least one integrally molded compliant flange configured to engage the sensor housing body engaging part and to secure the sensor housing cover to the sensor housing body, and longitudinal ridges extending outwardly and disposed substantially along the length of the sensor housing cover. The sensor housing engaging parts and flanges can provide a quick-lock mechanism operable to secure the sensor housing cover to the sensor housing body without the use of tools or fasteners.

14 Claims, 7 Drawing Sheets

(51) Int. Cl.
*H05K 5/00* (2006.01)
*H05K 5/02* (2006.01)

(52) U.S. Cl.
CPC ......... *H05K 5/0004* (2013.01); *H05K 5/0073* (2013.01); *H05K 5/0247* (2013.01)

(56) References Cited

U.S. PATENT DOCUMENTS

| | | |
|---|---|---|
| 2013/0142504 A1 | 6/2013 | Warren et al. |
| 2014/0118849 A1* | 5/2014 | Mori .................. G02B 9/04 |
| | | 359/715 |
| 2015/0070557 A1* | 3/2015 | Petty .................. H04N 5/2251 |
| | | 348/333.01 |
| 2015/0260886 A1* | 9/2015 | Higuchi ............... G02B 5/00 |
| | | 257/432 |
| 2016/0041453 A1* | 2/2016 | Pizzo .................. G02B 7/026 |
| | | 396/530 |
| 2016/0182773 A1* | 6/2016 | Tasselli .............. G08B 13/19619 |
| | | 348/373 |
| 2018/0052019 A1* | 2/2018 | Ghannam ............ G01D 11/245 |

FOREIGN PATENT DOCUMENTS

| | | |
|---|---|---|
| EP | 3035305 A1 | 6/2016 |
| JP | 2007 286201 A | 11/2007 |
| JP | 2007286201 A | 11/2007 |
| JP | 2016173631 A | 9/2016 |
| WO | 2000/04720 A1 | 1/2000 |
| WO | 0004720 A1 | 1/2000 |
| WO | 0143202 A2 | 6/2001 |
| WO | 2016167574 A1 | 10/2016 |

OTHER PUBLICATIONS

Communication Relating to the Results of the Partial International Search for International Application No. PCT/US2018/049023 dated Dec. 18, 2018.

* cited by examiner

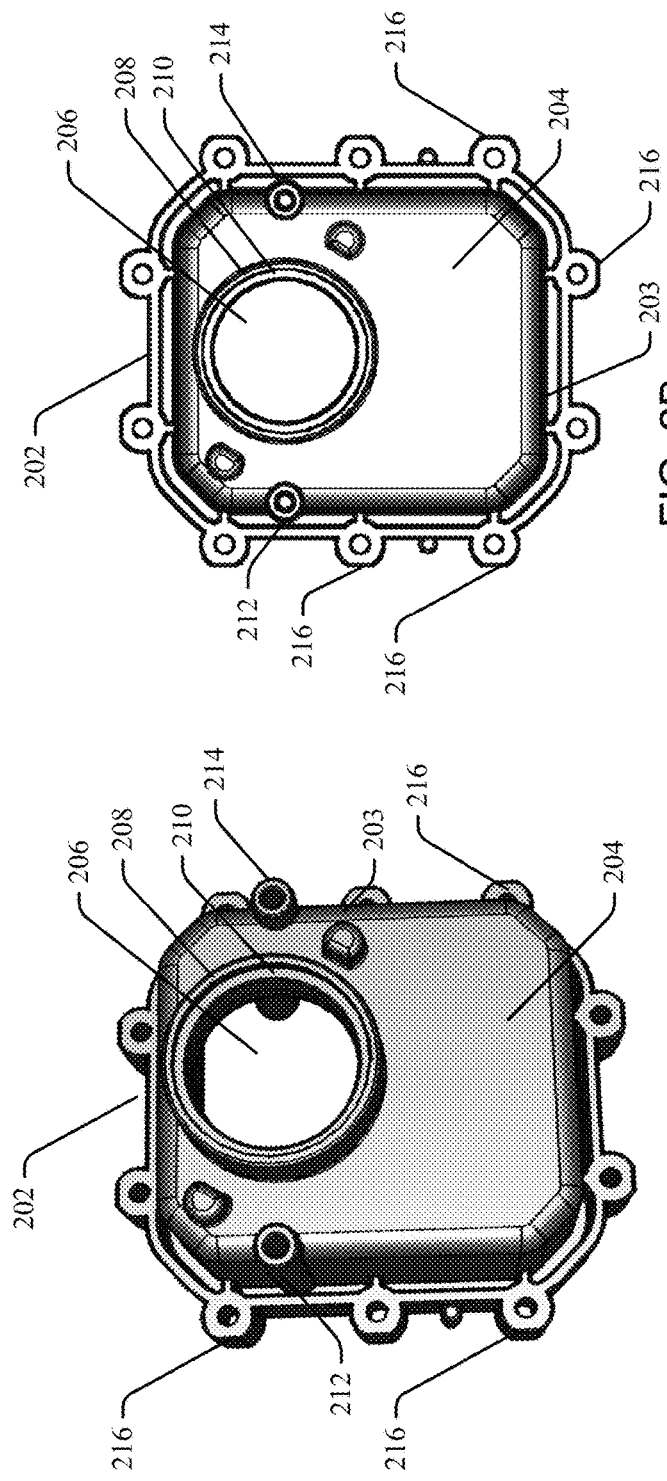
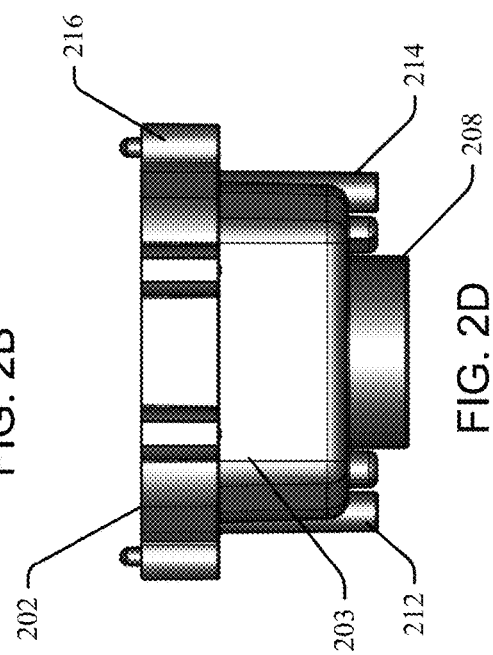
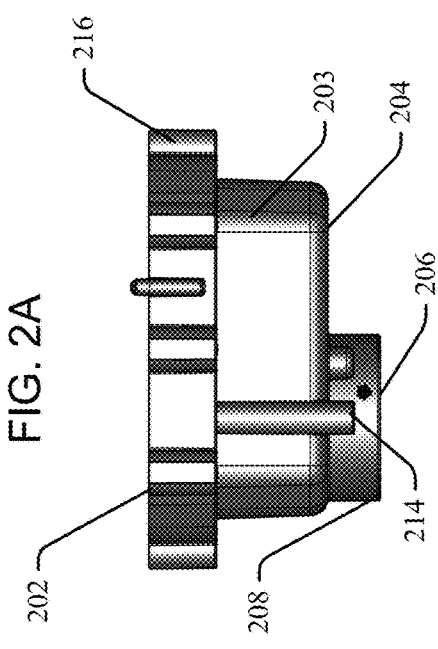
FIG. 2A
FIG. 2B
FIG. 2C
FIG. 2D

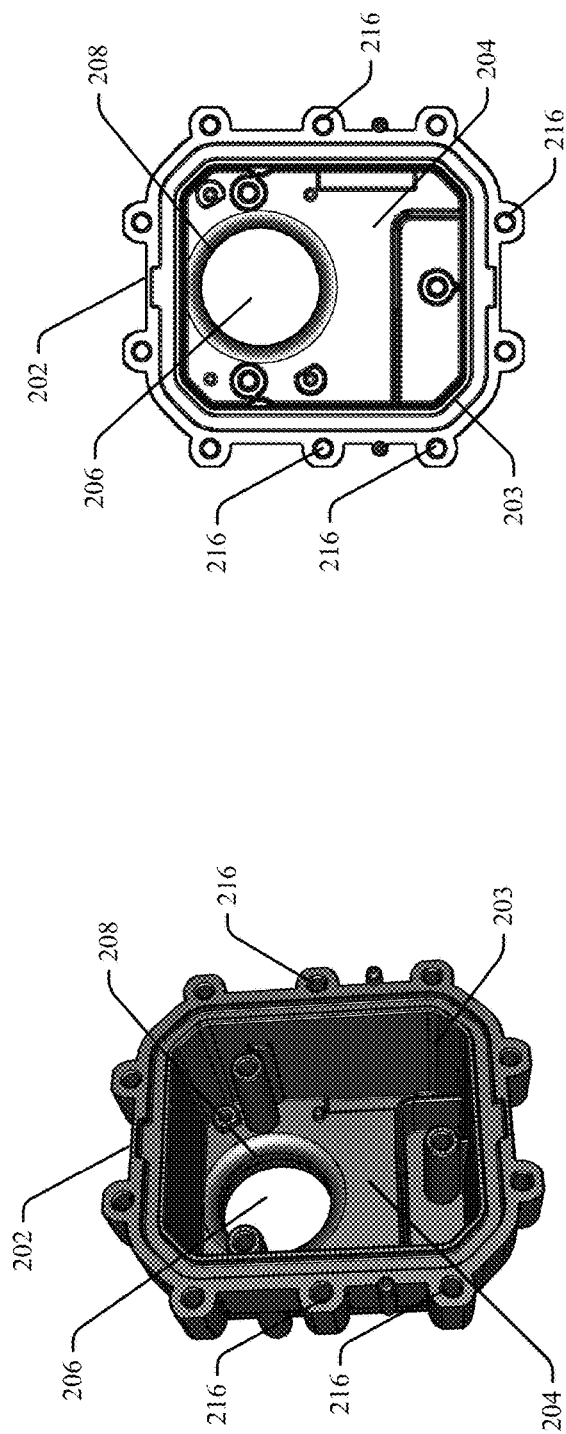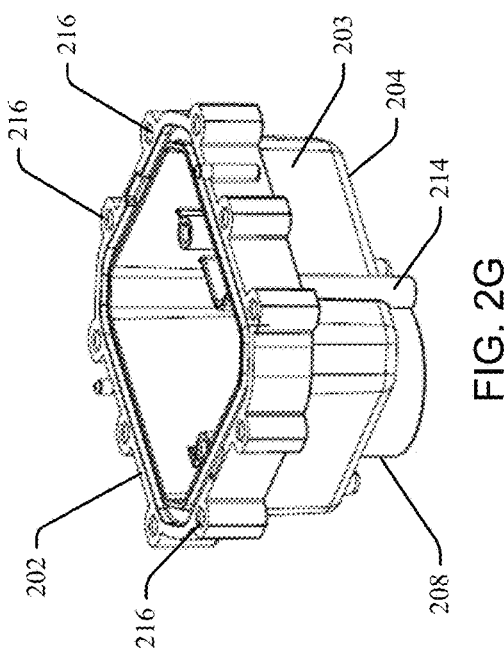
FIG. 2F
FIG. 2G
FIG. 2E

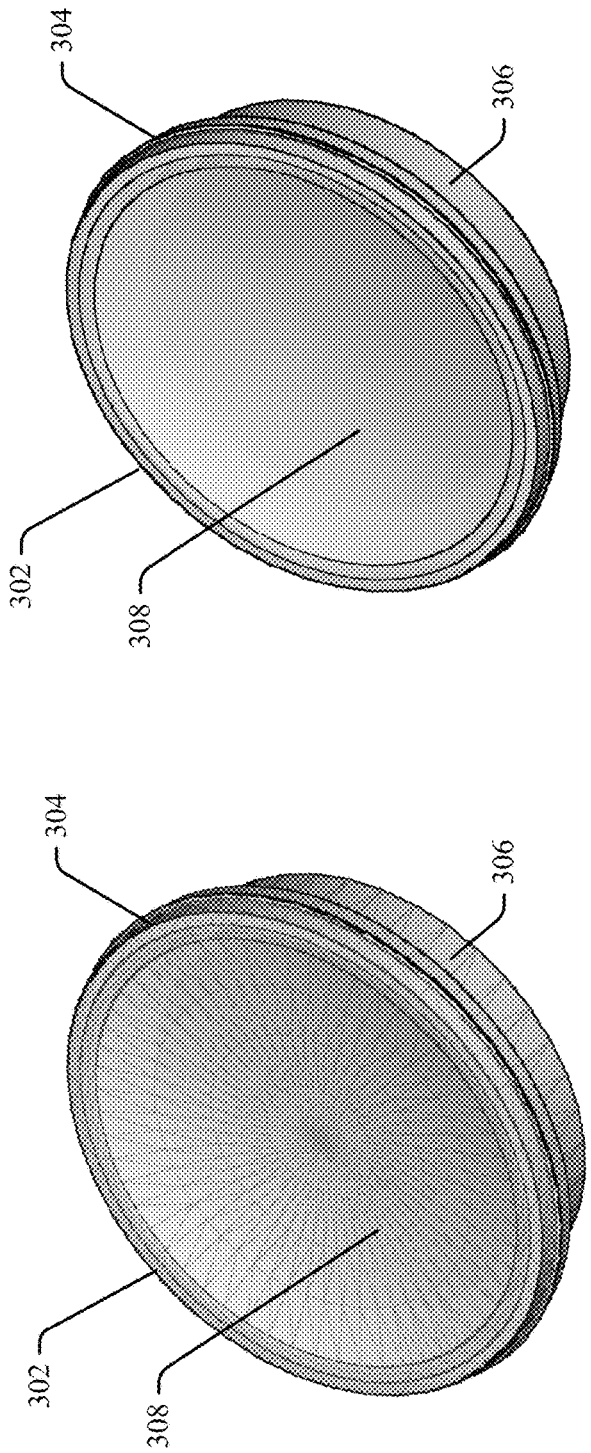
FIG. 3A
FIG. 3B
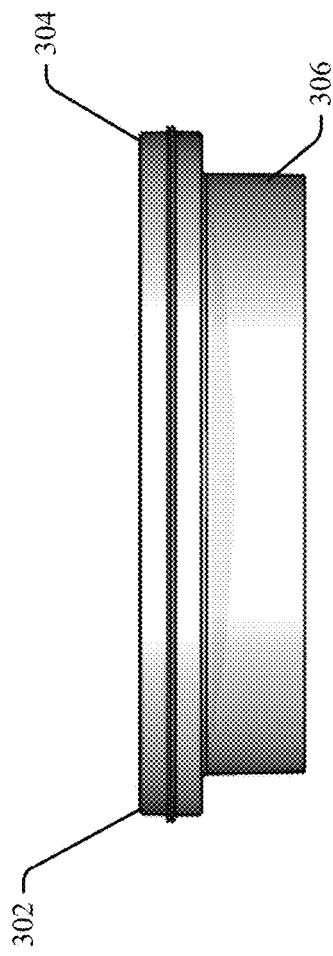
FIG. 3C

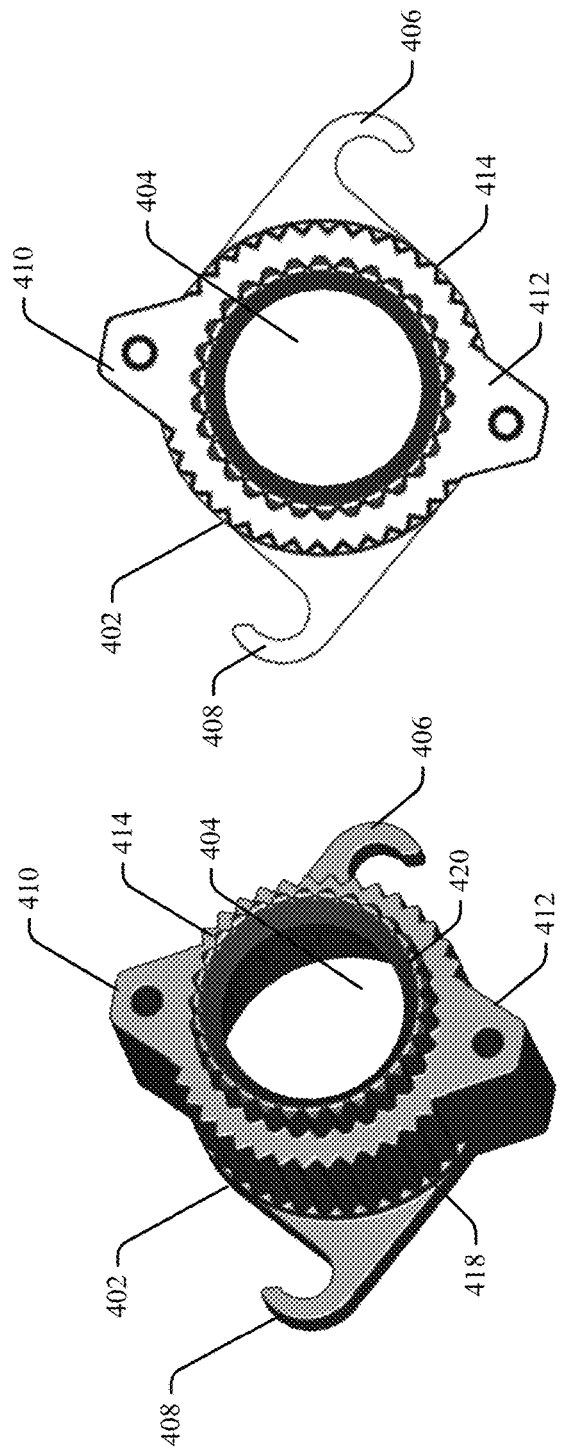
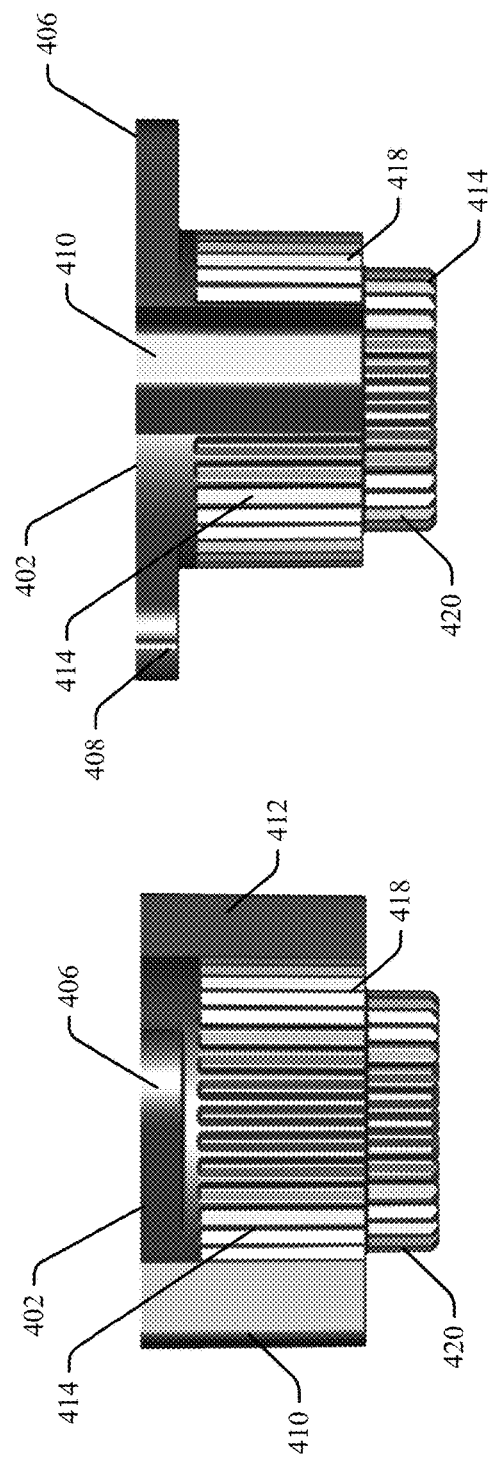
FIG. 4A
FIG. 4B
FIG. 4C
FIG. 4D

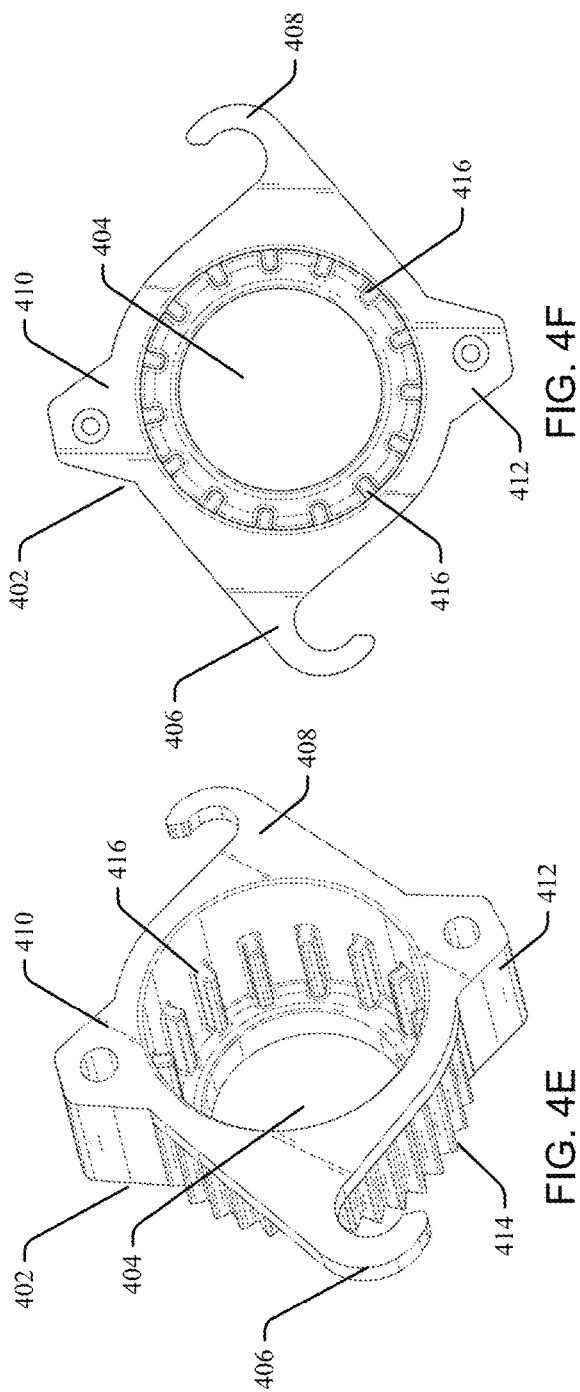
FIG. 4F
FIG. 4E
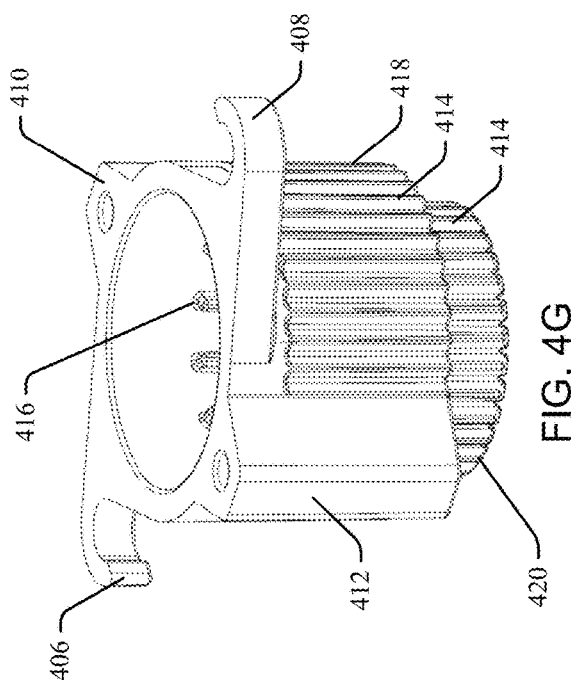
FIG. 4G

OPTICAL SENSOR HOUSING

CROSS REFERENCE TO RELATED APPLICATIONS

This application claims the benefit of U.S. Provisional Application No. 62/553,446 filed Sep. 1, 2017, the entire disclosure of which is hereby incorporated herein by reference.

FIELD OF THE INVENTION

This disclosure relates generally to housings for optical sensor systems, and in particular but not exclusively, to optical sensor housings for optical sensor systems in an outdoor environment.

BACKGROUND OF THE INVENTION

Optical imaging sensors collect coordinate data from object surfaces and can be useful in a wide variety of automation applications, including shape acquisition, assembly, inspection, and autonomous device navigation. The collected image data points represent surface geometry in a sampled form. The optical odometer is an active optical sensor that measures relative motion of a moving platform.

Positioning is a key task in most field robotics applications and can be very challenging in GPS-denied environments. A common tactic in such cases is to position visually. Accurate knowledge of position is needed for successful completion of field robotics tasks. In known or highly structured environments, localization relative to a predetermined map is typically performed using sensors appropriate for correlating map features with observations. In outdoor scenarios, various positioning and navigation systems are utilized in conjunction with input from odometry integration.

Many applications present significant challenges for positioning strategies utilizing optical sensors, and the use of optical sensors in outdoor environments presents difficulties in terms of reliability. For example, reduced performance is experienced in poorly lit or dirty environments. For autonomous device navigation, due to performance and cost considerations, the sensor is located somewhat close to the ground, and is particularly susceptible to blockage or fouling by dirt, debris, grass clippings, and moisture.

BRIEF SUMMARY OF THE INVENTION

The following presents a simplified summary in order to provide a basic understanding of some aspects of the disclosure. This summary is not an extensive overview of the disclosure. It is not intended to identify key/critical elements or to delineate the scope of the disclosure. Its sole purpose is to present some concepts of the disclosure in a simplified form as a prelude to the more detailed description that is presented later.

In an embodiment, a sensor housing for an optical sensor assembly includes a sensor housing body, including one or more support walls upstanding from a bottom portion and a substantially open top portion defining a cavity in which the optical sensor assembly is located, at least one aperture, at least one engaging part projecting orthogonally from an outside surface of the sensor housing body, and a sensor housing cover including an open central portion, at least one integrally molded compliant flange configured to engage the at least one sensor housing body engaging part and to removably secure the sensor housing cover to the sensor housing body, and a plurality of longitudinal ridges extending outwardly and disposed substantially along a length of the sensor housing cover.

In an embodiment, the at least one engaging part includes a pair of opposing engaging parts located in proximity to the aperture. In an embodiment, the least one flange includes a pair of opposing flanges located at a periphery of a top portion of the sensor housing cover.

In an embodiment, the at least one flange includes a generally C-shaped member. In an embodiment, the at least one engaging part includes a pair of opposing engaging parts located in proximity to the aperture, and the at least one flange includes a pair of opposing flanges located and configured to receive a portion of the engaging parts when the sensor housing cover is secured to the sensor housing body.

In an embodiment, the pair of opposing engaging parts and the pair of opposing flanges provide a quick-lock mechanism operable to secure the sensor housing cover to the sensor housing body without the use of a fastener.

In an embodiment, the pair of opposing engaging parts and the pair of opposing flanges provide a quick-lock mechanism operable to secure the sensor housing cover to the sensor housing body without the use of a tool.

In an embodiment, the pair of opposing engaging parts and the pair of opposing flanges provide a quick-lock mechanism operable to release the sensor housing cover from the sensor housing body without the use of a tool.

In an embodiment, the at least one engaging part includes a groove for engaging the at least one flange. In an embodiment, the plurality of ridges comprise linear and parallel peaked elevations forming channels therebetween.

In an embodiment, an inner portion of the sensor housing cover includes a plurality of ribs configured to secure an optical window within the aperture of the sensor housing body, and the ribs are operable to collect moisture and to cause the moisture to move in a downward direction exiting the inner portion of the sensor housing cover via the open central portion.

In an embodiment, an optical window is secured the sensor housing body by the sensor housing cover, and the optical window is configured to seal the sensor housing body aperture in alignment with the optical sensor assembly.

In an embodiment, the optical window and the sensor housing body form a unitary part.

In an embodiment, a surface of the optical window includes a material, coating, film, or layer having hydrophobic properties. In an embodiment, the sensor housing for an optical sensor assembly includes wherein a surface of the optical window includes a material, coating, film, or layer having hydrophilic properties.

In further embodiments, a sensor housing for an optical sensor assembly includes at least one support wall upstanding from a bottom portion, and an open top portion defining a cavity in which the optical sensor assembly is located, a substantially circular aperture formed through the thickness of the bottom portion and through which the optical sensor is operative, a projection having an open central portion and extending outwardly and orthogonally to the bottom portion, and a plurality of longitudinal ridges disposed substantially along the length of the projection.

To accomplish the foregoing and related ends, certain illustrative aspects of the disclosure are described herein in connection with the following description and the drawings. These aspects are indicative, however, of but a few of the various ways in which the principles of the disclosure can be employed and the subject disclosure is intended to include all such aspects and their equivalents. Other advantages and features of the disclosure will become apparent from the following detailed description of the disclosure when considered in conjunction with the drawings.

BRIEF DESCRIPTION OF THE DRAWINGS

The features of the disclosure, and their advantages, are illustrated specifically in embodiments of the invention now to be described, by way of example, with reference to the accompanying diagrammatic drawings, in which:

FIGS. 2A, 2B, 2C, 2D, 2E, 2F, and 2G are illustrations of example sensor housing bodies in accordance with aspects of the disclosure;

FIGS. 3A, 3B, 3C, 3D, 3E, and 3F are illustrations of example sensor housing windows in accordance with aspects of the disclosure; and FIGS. 4A, 4B, 4C, 4D, 4E, 4F, and 4G are illustrations of example sensor housing covers in accordance with aspects of the disclosure.

Figure 1:
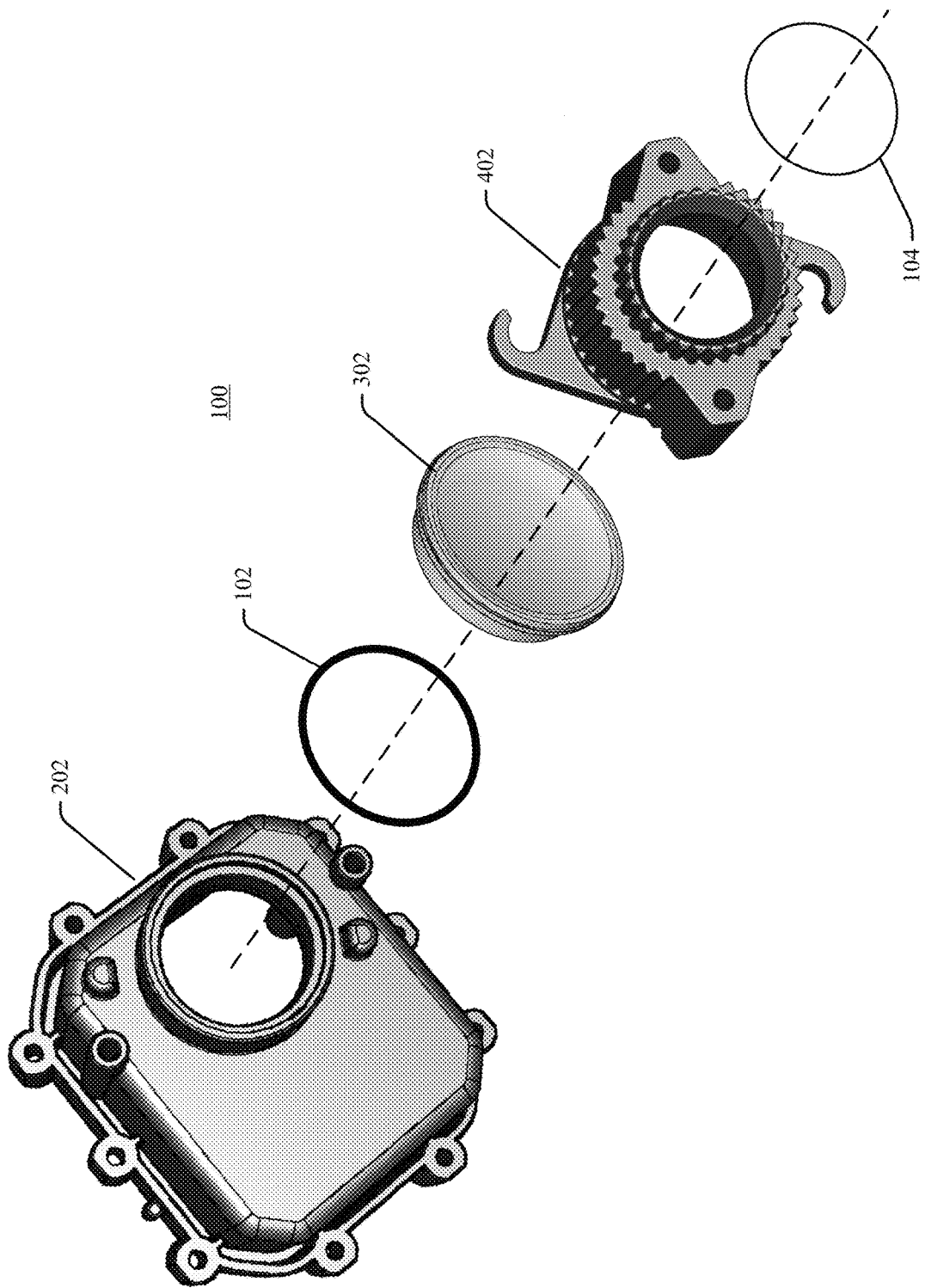
FIG. 1 is an illustration of an example optical sensor housing in accordance with an aspect of the disclosure.
Figure 3E:
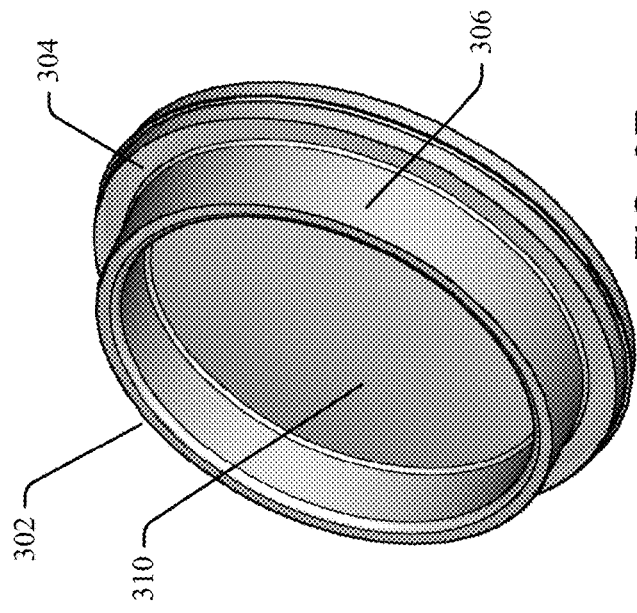
Figure 3D:
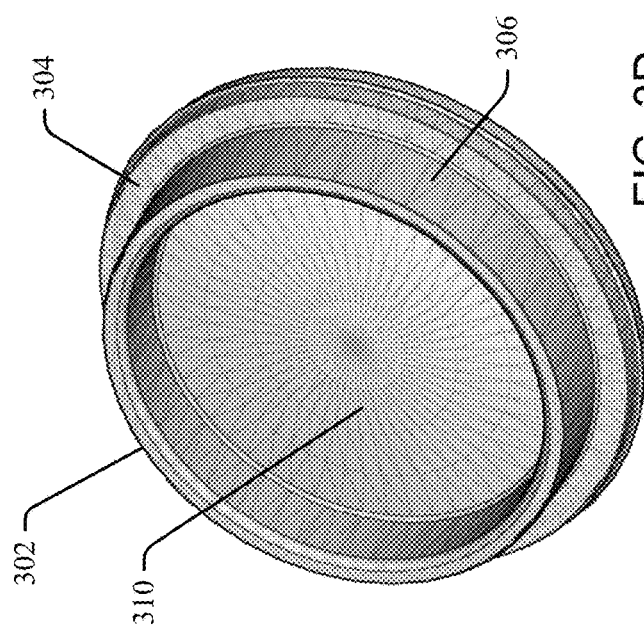
Figure 3F:
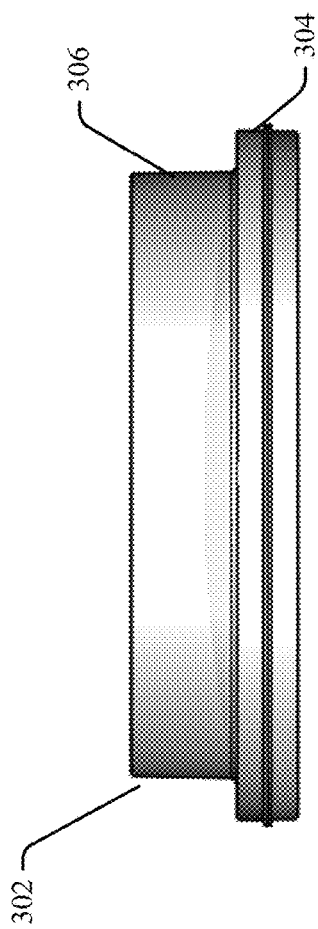

It should be noted that all the drawings are diagrammatic and not drawn to scale. Relative dimensions and proportions of parts of these figures have been shown exaggerated or reduced in size for the sake of clarity and convenience in the drawings. The same reference numbers are generally used to refer to corresponding or similar features in the different embodiments. Accordingly, the drawings and description are to be regarded as illustrative in nature and not as restrictive.

DETAILED DESCRIPTION

Embodiments of an optical sensor housing are disclosed. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

For purposes of description herein, the terms "upper", "lower", "top", "bottom", "upward", "downward", and derivatives thereof, shall relate to the optical sensor housing as oriented and shown, for example, in FIGS. 2C and 2D.

The optical odometer is an active optical sensor that measures relative motion of a moving platform. Due to performance, cost, and packaging considerations, this sensor is located somewhat close to the ground and is susceptible to blockage or fouling by dirt, debris, dew, condensation, etc. The disclosed technology minimizes the opportunity for the blockage or fouling of the optical sensor that could result in degraded performance of the sensor. One aspect of the disclosed technology is a quick-lock mechanism which provides simple, tool-free access for cleaning and inspection of both an optical sensor housing and an optical sensor assembly.

In general, conventional optical sensors include a light source, e.g. light-emitting diodes (LEDS), disposed in a lower part of the sensor that illuminate a plane below where the optical sensor assembly is positioned. Light is reflected by the plane and focused on a lens of the sensor, The focused light is converted into an electrical signal. The electrical signal corresponding to the image data of the illuminated portion of the plane can be processed by a digital signal processor to determine the moving direction and distance travelled of the optical sensor.

One or more optical odometry modules, including an optical sensor assembly, can be utilized for autonomous device navigation, and are mounted on a chassis of the autonomous device facing downward in close proximity to the ground. In some applications, the optical sensor assembly, and associated housing assembly, can be mounted at a height of between about 100 mm and 300 mm from the ground.

The optical odometry modules incorporate optical sensors, for example, for measuring the distance and direction traveled by the autonomous device. Data obtained from the optical odometry modules can be combined with other absolute or local positioning data to determine a position and heading of the autonomous device.

In an embodiment, a sensor housing for an optical sensor assembly includes a sensor housing body including one or more support walls upstanding from a planar bottom portion and a substantially open top portion defining a cavity in which the optical sensor assembly is located, at least one aperture, and at least one engaging part projecting orthogonally from an outside surface of the sensor housing body, and a sensor housing cover including an open central portion, at least one integrally molded compliant flange configured to engage the at least one sensor housing body engaging part and to secure the sensor housing cover to the sensor housing body, and a plurality of longitudinal ridges extending outwardly and disposed substantially along the length of the sensor housing cover.

Referring to FIG. 1, an optical sensor housing 100 in accordance with the disclosed technology can include a sensor housing body 202, an optional gasket 102, an optical window 302, a sensor housing cover 402, and an optional window 104. In an embodiment, an optical sensor assembly (not shown) is located within the optical sensor housing 100, and the optical sensor housing 100 including the optical sensor assembly is coupled to the underside of an autonomous machine. The optical sensor assembly is positioned so that it is approximately parallel with the ground.

While the optical sensor housing 100 as shown in FIG. 1 illustrates the sensor housing body 202, an optional gasket 102, an optical window 302, a sensor housing cover 402, and an optional window 104 as separate units, in an embodiment, the optical sensor housing 100 can include a unitary construction. For example the housing body 202, optical window 302, and sensor housing cover 402 can be formed as single part. In other embodiments, any of the housing body 202, optical window 302, and/or sensor housing cover 402 can be formed as a unitary optical sensor housing 100. An example injection molding system can utilize a plurality of injection cavity slides forming a single cavity allowing for the formation of an optical sensor housing 100 having a unitary structure.

Referring to FIGS. 2A-2G, an exemplary sensor housing body 202 comprises a support wall 203 upstanding from a planar bottom portion 204, and a substantially open top portion, so that the sensor housing body 202 defines a cavity in which an optical sensor assembly is located. The bottom portion 204 includes an aperture 206 formed through the thickness thereof, and through which the optical sensor is operative.

In other embodiments, sensor housing body 202 comprises a generally rectangular, square or cylindrical structure having a cross-section and a continuous support wall 203 upstanding from a substantially planar bottom portion 204, and forming a cavity in which an optical sensor assembly can be located. In other embodiments, the sensor housing body 202 can include most any other shape and/or dimensions suitable for enclosing the optical sensor assembly. For example, an optimal shape and size of the sensor housing body 202 can be determined based on the dimensions of the optical sensor assembly to be accommodated therein.

In yet another embodiment, rather than a substantially open top portion, the sensor housing body 202 is provided with an optional top portion or lid (not shown).

In an embodiment, the aperture 206 is generally circular, and includes a surrounding circumferential ring 208 extending outwardly from the bottom portion 204, and forming a shoulder 210 for receiving the optical window 302. In an embodiment, the aperture 206 is configured to accommodate an optional gasket 102, e.g. an O-ring, secured in place between the optical window 302 and the housing body 202. The gasket 102 can provide a seal that prevents or reduces the intrusion of moisture, dust, and debris into the sensor housing body 202 and to the optical sensor assembly.

In an embodiment, a plastic injection over molding method is utilized to intrinsically seal the optical window 302 and the housing body 202 together. For example, the plastic resin for forming the housing body 202 can be injected directly onto and around the window 302 during the molding process, forming a seal between optical window 302 and the housing body 202, and eliminating the use of the optional gasket 102. In this exemplary embodiment, the optical window 302 and the housing body 202 form a unitary part.

The bottom portion 204 includes a pair of engaging parts 212, 214 extending orthogonally to an outer surface of the bottom portion 204, and located proximate to the aperture 206. The engaging parts 212, 214 are configured to engage with and to removably secure the sensor housing cover 402. In an embodiment, the engaging parts 212, 214 include a post, stud, and/or other projection configured to engage the flanges 406, 408 of the sensor housing cover 402. In an embodiment, the engaging parts 212, 214 include a groove (not shown) for engaging a portion of the sensor housing cover 402. In an embodiment, the outer surface of the bottom portion 204 includes a single engaging part, or can include a plurality of engaging parts for engagement with corresponding structures of the sensor housing cover 402.

The sensor housing body 202 can include a plurality of openings 216 for insertion of fasteners there through, and for securing the sensor housing 100 to a machine, platform, or other device or structure.

In an embodiment, the sensor housing body 202 can include one or more protected air inlets 218, for example, a snorkel-type, or filtered vent, which allows air to enter without carrying any debris or dirt. During operation, air flow is encouraged in through the protected air inlet producing a stream of air which moves past the window 302, and encourages the movement of moisture, dust, and other debris away from the window 302 and the optical sensor assembly. The air inlet 218 can also normalize moisture levels inside the sensor housing body 202 with the ambient air.

Referring to FIGS. 3A-3G, a clear optical window 302 allows the optical sensor within the optical sensor housing 100, to image the ground below it. In an embodiment, the optical window 302 is generally circular and has a surrounding, ring-shaped thickened edge 304, forming a shoulder 306. The thickened edge 304 is proportioned to fit into the aperture 206 of the sensor housing body 202.

In an embodiment, the optical window 302 includes an outer surface 308 having a concave shape. As an example, an outer surface 308 of the optical window 302 can be concave, and a second surface 310 (an inner surface) thereof can be convex. The optical window 302 can be formed of a material that is optically clear, e.g. transparent or translucent, and having high light transmissivity. For example, the window can be formed of plastic. However, the window material is not limited to the plastic. For example, the window 302 can be formed of glass. In an embodiment, the window 302 can include optical properties affecting the illumination or imaging of the target plane.

The outer and/or inner surfaces 308, 310 of the window 202 can include a coating, film, or layer possessing hydrophobic properties and which naturally repels water, causing droplets to form. A hydrophobic material repels liquids by causing the liquid to bead-up on the material's surface, and not spread out or wet the material's surface. A hydrophobic surface can prevent or reduce the accumulation of dust, dirt, debris, and moisture on the surfaces of the window that might otherwise interfere with the accuracy of the sensor. The hydrophobic coating can help reduce water-spots and mineral deposits left behind by water that has evaporated.

The window's outer and/or inner surfaces 308, 310 can optionally be self-cleaning due to movement of water droplets over the surface. Water droplets can be easily shed, for example, from the window's hydrophobic surface due to minimized adhesion forces between the window's surfaces 308, 310 and the water or moisture.

In an embodiment, an inner convex surface of the optical window 302 includes a material, coating, film, or layer having hydrophilic properties, and an outer concave surface of the optical window 302 includes a material, coating, film, or layer having hydrophobic properties.

In other embodiments, the outer and/or inner surfaces 308, 310 of the optical window 302 can include a coating film, or layer possessing hydrophilic properties. Hydrophilic materials have an affinity for water causing it to spread across a surface, and maximizing contact with the surface, and to reduce the impact on the sensing system.

In an embodiment, a hydrophilic coating on the optical window 302 encourages condensation from fog, and the resulting droplets can move towards the edges of the concave outer surface 310 of the window, and can be funneled toward the ground aided by the force of gravity.

Beads of water encouraged by either of the hydrophobic or hydrophilic coatings can pick up deposited dirt, dust, debris, and the like, that would otherwise accumulate on the surface of the window, impeding the function and performance of the optical sensor. The water beads or droplets are shed from the window 302 carrying the dirt and debris away.

In an embodiment, a replaceable film protector, for example, a plastic or tempered glass film, can be applied to the optical window's 302 surfaces 308, 310. The plastic film protectors can be comprised of PET (polyethylene terephthalate), TPU (thermoplastic polyurethane), or other thin film plastics. The film protector can help shield the window from damage, and can be easily cleaned or replaced.

Referring now to FIGS. 4A-4G, in an embodiment, a sensor housing cover 402 includes an open central portion 404, a pair of integrally molded opposing flanges 406, 408 for securing the sensor housing cover 402 to the sensor housing body 202, and a pair of integrally molded opposing ears 410, 412. The open central portion 404 extends substantially coaxially with respect to the longitudinal axis of the elongate sensor housing cover 402.

The overall shape and proportions of the sensor housing cover 402 reduces the opportunity for debris and moisture to impede the operation of the optical sensor across most environmental and operational conditions. The sensor housing cover 402 is further configured to allow for accurate and efficient operation of the optical sensor and does not impede either the illumination or imaging aspects of the optical sensor.

In an embodiment, the sensor housing cover 402 is a substantially cylindrical structure, however, the sensor housing cover 402 can include an elongate body having most any cross-section and including an open central portion for operation of the optical sensor therethrough.

An outer portion of the sensor housing cover 402 is provided with a plurality of longitudinal ridges 414 running substantially along the length of the sensor housing cover 402. An inner portion of the sensor housing cover 402 is provided with ribs 416.

In further embodiments, the sensor housing body 202 and sensor housing cover 402 can be integrally formed as a single molded piece. A sensor housing 100 can include one or more support walls 203 upstanding from a bottom portion, and a substantially open top portion defining a cavity in which the optical sensor assembly is located. The optical sensor is operative through a substantially circular aperture formed through the thickness of the bottom portion. A projection extends outwardly and orthogonally to the bottom portion, and a plurality of longitudinal ridges can be disposed substantially along the length of the projection. In an embodiment, the projection comprises a substantially cylindrical structure, but can have most any cross-section having an open central portion through which the optical sensor is operative.

As illustrated best in FIGS. 4A, 4C, 4D and 4G, the sensor housing cover 402 includes a larger diameter top section 418, and a smaller diameter bottom section 420. An interior of the top section 418 can be provided with ribs 416. The ribs 416 can be integrally formed on an inner portion of the sensor housing cover 402.

The larger diameter top section 418, of the sensor housing cover 402, can be shaped and proportioned so as to provide a close fit to the shoulder 210 of sensor housing body 202. In an embodiment, the thickened edge 304 of the optical window 302 is held against a top portion of the ribs 416 of the sensor housing cover 402. The ribs 416 provide accurate and secure positioning of the window 302 in alignment with the opening 404 of the sensor housing cover 402, and in alignment the aperture 206 in the sensor housing body 202.

The ribs 416 help to encourage water droplet formation and shedding of the water droplets downward through the interior of the bottom section 420 of the sensor housing cover 402, and out through the opening 404. The ribs 416 also help reduce costs by decreasing the required thickness of the sensor housing cover 402.

The smaller diameter bottom section 420 of the sensor housing cover 402 aids the operation of the optical sensor assembly, and is sized to provide an optimal field of view for the optical sensor downward to the plane below. The smaller diameter bottom section 420 also helps to inhibit the collection of debris and moisture, on and in the sensor housing cover 402 and the window 302, that could impede the operation of the optical sensor assembly.

The flanges 406, 408 include outer ends that are generally C-shaped as shown in FIGS. 4A, 4B, 4E and 4F. The flanges 406, 408 are flexible and are configured to receive a portion of the engaging parts 212, 214 of the housing body 202. In other embodiments, the flanges 406, 408 can include most any other open or closed shape having an opening or slot capable of engaging with the engaging parts 212, 214 of the sensor housing body 202. In an embodiment, the sensor housing cover 402 includes a single flange, but can include a plurality of flanges. The one or more flanges 406, 408 exert forces against the engaging part 212, 214 and are operable to removably secure the sensor housing cover 402 and the window 302 to the sensor housing body 202.

In an embodiment, the flanges 406, 408 provide a quick-lock mechanism for securing the sensor housing cover 402 to the sensor housing body 202. The sensor housing cover 402 can be removably secured to the sensor housing body 202 by placing the flanges 406, 408 in contact with the bottom surface 204 of the sensor housing body 202, and on either side of the engaging parts 212, 214, and engaging each flange 406, 408 with a respective engaging part 212, 214 using, for example, a clockwise twisting motion.

In an embodiment, the flanges 406, 408 provide a quick-lock mechanism for easy removal of the sensor housing cover 402 from the sensor housing body 202. The flanges 406, 408 can be released from the respective engaging parts 212, 214 using, for example, a counter-clockwise twisting motion. Thus, the need for tools and/or fasteners is eliminated.

In an embodiment, the flexible portions of the flanges 406, 408 are configured to engage a groove (not shown) of the engaging parts 212, 214. The ridges 414 and/or the ears 410, 412 can help provide grip and leverage when installing and removing the sensor housing cover 402.

The engagement of the flexible flanges 406, 408 with the engaging parts 212, 214 provides a secure connection of the sensor housing cover 402 to the sensor housing body 202. Thus, the sensor housing cover 402 can be installed and removed without need for tools. The sensor housing cover 402 can easily and quickly be removed facilitating the inspection, cleaning, re-installation, or replacement of the sensor housing cover 402 or window 302. In aspects, the sensor housing cover 402 can be installed and removed without the use of fasteners. For example, the sensor housing cover 402 is secured to the sensor housing body 202 without the use of additional hardware or fasteners such as screws, nuts, bolts, clips, clamps, straps, hook and loop, and the like.

A plurality of longitudinal channels form spaced apart ridges 414 along the length of the sensor housing cover 402. In an embodiment, the ridges 414 include linear and parallel peaked elevations forming channels interposed therebetween. The plurality of spaced apart elongate ridges 414 extend longitudinally along the outer surface of the sensor housing cover 402, and extend outward from the sensor housing cover's outer surface. In an embodiment, the ridges 414 are linear and parallel to each other. In an embodiment, a ridge 414 includes a peaked elevation at about the longitudinal axial center point of the ridge 414.

The placement and proportions of the ridges 414 discourage dirt and debris from collecting on the sensor housing cover 402. The ridges 414 also help to encourage water droplet formation and shedding of the water droplets, dirt, and debris downward along the ridges 414 away from the sensor housing cover 402, and thus away from the sensor housing 100, and towards the ground.

In an embodiment, the sensor housing cover 402 can include a duct or protected air inlet vent or duct (not shown) located in a side wall of the bottom section 420. For example, a snorkel-type or filtered vent allows air to enter without carrying any debris or dirt. During operation, air flow is encouraged in through the protected air inlet producing a stream of air which moves across the central portion of the window 302 outward and down along the inside periphery of the sensor housing cover 402, and encouraging the exit and discharge of moisture, dust, and other debris away from the window 302. The air inlet vent or duct can also normalize moisture levels inside the sensor housing cover 402 with the ambient air.

Referring back to FIG. 1, an optional window 104 can be installed at the opening of the bottom section 420 of the sensor housing cover 402. The window 104 prevents moisture, dirt and/or debris from entering the inside of the sensor housing cover 402, and from reaching the optical window 302. The window 104 can include the same or similar self-cleaning features as the optical window 302, discussed in detail above. A gasket or O-ring can provide a seal that further prevents or reduces the intrusion of moisture, dust, and debris into the sensor housing cover 402.

While embodiments have been described, it should be understood that the disclosed technology is not so limited and modifications may be made without departing from the disclosed technology. The scope of the optical sensor housing is defined by the appended claims, and all devices, processes, and methods that come within the meaning of the claims, either literally or by equivalence, are intended to be embraced therein.

The invention claimed is:

1. A sensor housing for an optical sensor assembly, comprising:
    a sensor housing body comprising
        one or more support walls upstanding from a bottom portion and a substantially open top portion defining a cavity in which the optical sensor assembly is located;
        at least one aperture; and
        at least one engaging part projecting orthogonally from an outside surface of the sensor housing body; and
    a sensor housing cover comprising:
        an open central portion;
        at least one integrally molded compliant flange configured to engage the at least one sensor housing body engaging part and to removably secure the sensor housing cover to the sensor housing body; and
        a plurality of longitudinal ridges extending outwardly and disposed substantially along a length of the sensor housing cover;
        wherein an inner portion of the sensor housing cover comprises a plurality of ribs configured to secure an optical window within the aperture of the sensor housing body, and wherein the ribs are operable to collect moisture and to cause the moisture to move in a downward direction exiting the inner portion of the sensor housing cover via the open central portion.

2. The sensor housing for an optical sensor assembly of claim 1, wherein the at least one engaging part comprises a pair of opposing engaging parts located in proximity to the aperture.

3. The sensor housing for an optical sensor assembly of claim 1, wherein the at least one flange comprises a pair of opposing flanges located at a periphery of a top portion of the sensor housing cover.

4. The sensor housing for an optical sensor assembly of claim 1, wherein the at least one flange comprises a generally C-shaped member.

5. The sensor housing for an optical sensor assembly of claim 1, wherein
    the at least one engaging part comprises a pair of opposing engaging parts located in proximity to the aperture; and
    the at least one flange comprises a pair of opposing flanges located and configured to receive a portion of the engaging parts when the sensor housing cover is secured to the sensor housing body.

6. The sensor housing for an optical sensor assembly of claim 5, wherein the pair of opposing engaging parts and the pair of opposing flanges provide a quick-lock mechanism operable to secure the sensor housing cover to the sensor housing body without the use of a fastener.

7. The sensor housing for an optical sensor assembly of claim 5, wherein the pair of opposing engaging parts and the pair of opposing flanges provide a quick-lock mechanism operable to secure the sensor housing cover to the sensor housing body without the use of a tool.

8. The sensor housing for an optical sensor assembly of claim 5, wherein the pair of opposing engaging parts and the pair of opposing flanges provide a quick-lock mechanism operable to release the sensor housing cover from the sensor housing body without the use of a tool.

9. The sensor housing for an optical sensor assembly of claim 1, wherein the at least one engaging part includes a groove for engaging the at least one flange.

10. The sensor housing for an optical sensor assembly of claim 1, wherein the plurality of ridges comprise linear and parallel elevations forming channels therebetween.

11. The sensor housing for an optical sensor assembly of claim 1, wherein the optical window is secured the sensor housing body by the sensor housing cover, and the optical window is configured to seal the sensor housing body aperture in alignment with the optical sensor assembly.

12. The sensor housing for an optical sensor assembly of claim 11, wherein the optical window and the sensor housing body form a unitary part.

13. The sensor housing for an optical sensor assembly of claim 11, wherein a surface of the optical window comprises a material, coating, film, or layer having hydrophobic properties.

14. The sensor housing for an optical sensor assembly of claim 11, wherein a surface of the optical window comprises a material, coating, film, or layer having hydrophilic properties.

* * * * *